United States Patent [19]
Itoh

[11] Patent Number: 5,696,450
[45] Date of Patent: Dec. 9, 1997

[54] AUTOMATIC SAFETY TEST EQUIPMENT FOR PRINTED CIRCUIT BOARD

[75] Inventor: Nobuyuki Itoh, Kanagawa-ken, Japan

[73] Assignee: Fujitsu General Limited, Kanagawa-ken, Japan

[21] Appl. No.: 516,697

[22] Filed: Aug. 18, 1995

[30] Foreign Application Priority Data

Aug. 19, 1994 [JP] Japan .................. 6-195725

[51] Int. Cl.⁶ .................................. G01R 31/02
[52] U.S. Cl. ................. 324/537; 324/158.1; 324/73.1; 364/550
[58] Field of Search ................. 324/537, 158.1, 324/73.1; 364/550, 551.01, 579

[56] References Cited

U.S. PATENT DOCUMENTS

| | | | |
|---|---|---|---|
| 3,803,413 | 4/1974 | Vanzetti et al. | 250/338.1 |
| 4,379,992 | 4/1983 | Geisel . | |
| 4,434,489 | 2/1984 | Blyth | 324/73.1 X |
| 4,749,943 | 6/1988 | Black | 324/754 |
| 4,760,330 | 7/1988 | Lias, Jr. | 395/183.08 |
| 4,807,161 | 2/1989 | Comfort et al. | 364/550 |
| 4,857,833 | 8/1989 | Gonzales et al. | 324/512 |
| 4,862,067 | 8/1989 | Brune et al. . | |
| 5,469,064 | 11/1995 | Kerschner et al. | 324/537 |
| 5,504,432 | 4/1996 | Chandler et al. | 324/537 |

FOREIGN PATENT DOCUMENTS

| | | |
|---|---|---|
| 0 206 709 A2 | 12/1986 | European Pat. Off. . |
| 0 373 069 A1 | 6/1990 | European Pat. Off. . |
| 0 050 014 A1 | 4/1992 | European Pat. Off. . |
| 56-110059 | 9/1981 | Japan . |
| 2 086 061 | 5/1982 | United Kingdom . |

OTHER PUBLICATIONS

Electronic Design, vol. 28, No. 8, 12 Apr. 1980, pp. 32 XP002015056, "TV cameras, computer and printer make hybrid inspection a snap".

Solid State Technology, vol. 14, No. 9, Sep. 1971, pp. 41–47, XP002015057, Allen R. Gerhard and Lewis P. Perkick: "Computerized testing of hin film circuit conductors".

Primary Examiner—Ernest F. Karlsen
Assistant Examiner—Diep Do
Attorney, Agent, or Firm—Lowe, Price, LeBlanc & Becker

[57] ABSTRACT

When one performs an interpart short-circuit test where short-circuit is made between the terminals of the parts mounted on the printed circuit board 1 to find out the existence of fuming, firing and red heating, a spacing test that verifies if the distance between the patterns of the printed circuit board meets the prescribed insulating clearance, and an interpattern short-circuit test that verifies the existence of fuming and firing by shorting between the patterns that do not satisfy the prescribed insulating distance, an automatic tester receives the printed circuit board 1 to carry on the safety test, a control unit outputs the signal that controls said automatic tester and inputs the data of the test results, a detecting means detects the respective test results of fuming, firing and red heating, the memory incorporated into the control unit stores the data, and a recording means records the test results.

13 Claims, 5 Drawing Sheets

AUTOMATIC SAFETY TEST EQUIPMENT FOR PRINTED CIRCUIT BOARD

BACKGROUND OF THE INVENTION

1. Field of the Invention

This invention relates to a safety test equipment that performs automatically a number of safety tests to diagnose any defects in designing printed circuit boards. The printed circuit boards, even though they are not particularly problematical when used under normal conditions as products with electrical devices mounted, are compelled to undergo the safety tests based on the safety standards to see if they remain safe against the defects arising in the designing, that is, when interpart and/or interpattern short-circuits are enforced. This invention relates more particularly to an equipment that can perform automatically several safety tests all by itself.

2. Description of the Prior Art

In general, the safety test of the printed circuit board with electrical devices mounted includes mainly the interpart short-circuit, spacing and interpattern short-circuit tests.

The subjects of said short-circuit test between the parts are such parts that are made to act at a fixed voltage or higher. Short-circuit is caused to occur between the terminals of said parts to see if there be any fuming or firing produced and, at the same time, to verify possible existence of two or more pieces of parts that are heated red.

The spacing test is intended to check if the distance between the patterns of the printed circuit boards satisfies the specified insulating clearance.

The purpose of the short-circuit test between the patterns is to check the existence of fuming and/or firing by causing a short-circuit to be produced between such patterns as have not turned out to meet the prescribed insulating distance as a result of said spacing test.

Conventionally, a sole equipment could in no way perform automatically such safety tests as interpart short-circuit, spacing, and interpattern short-circuit tests. Almost all testers of this sort were manually operated. They were therefore problematical in that the more numerous the parts and patterns that constitute the circuitry, not only more enormous the labor and time become required for such tests, but more frequently the parts are overlooked that form the subjects of the tests.

In the Japanese patent Application No. 163372/1981 (Priority: GB80.10.13 80 8033007), disclosed has been an automatic tester that examines possible disconnection and short-circuit of printed circuit boards in some mass production lines.

This test equipment however is intended only to check any disconnection and short-circuit of the printed circuit boards when assembling some parts, not to be regarded as what can be called "safety equipment," objects of our invention.

BRIEF SUMMARY OF THE INVENTION (1) The primary object of this invention is to furnish an equipment that can perform all the interpart short-circuit, spacing, interpattern short-circuit and other safety tests by itself without recourse to any personal attendance.

(2) The second purpose of this invention is to provide such an equipment that can work out the tests precisely and within a limited time despite increased number of parts and patterns that constitute the circuitry.

To achieve these objectives, this invention supplies, in a safety test that performs the interpart short-circuit test, spacing test and interpattern short-circuit test, an automatic tester that carries on said safety tests receiving the printed circuit boards, a control unit that regulates the automatic tester, a detecting means that can detect both the results of the fuming and firing tests by short-circuiting between the terminals of the parts and the results of the test aiming at the verification of possible red heating of two or more pieces of parts, a memory that stores the data concerned, a displaying means that display the test results, and finally a recording means that can record these same results.

(3) Any other objectives of this invention will be understood referring to the following detailed description and to the working examples explained later in this text.

DETAILED DESCRIPTION

Figure 1:
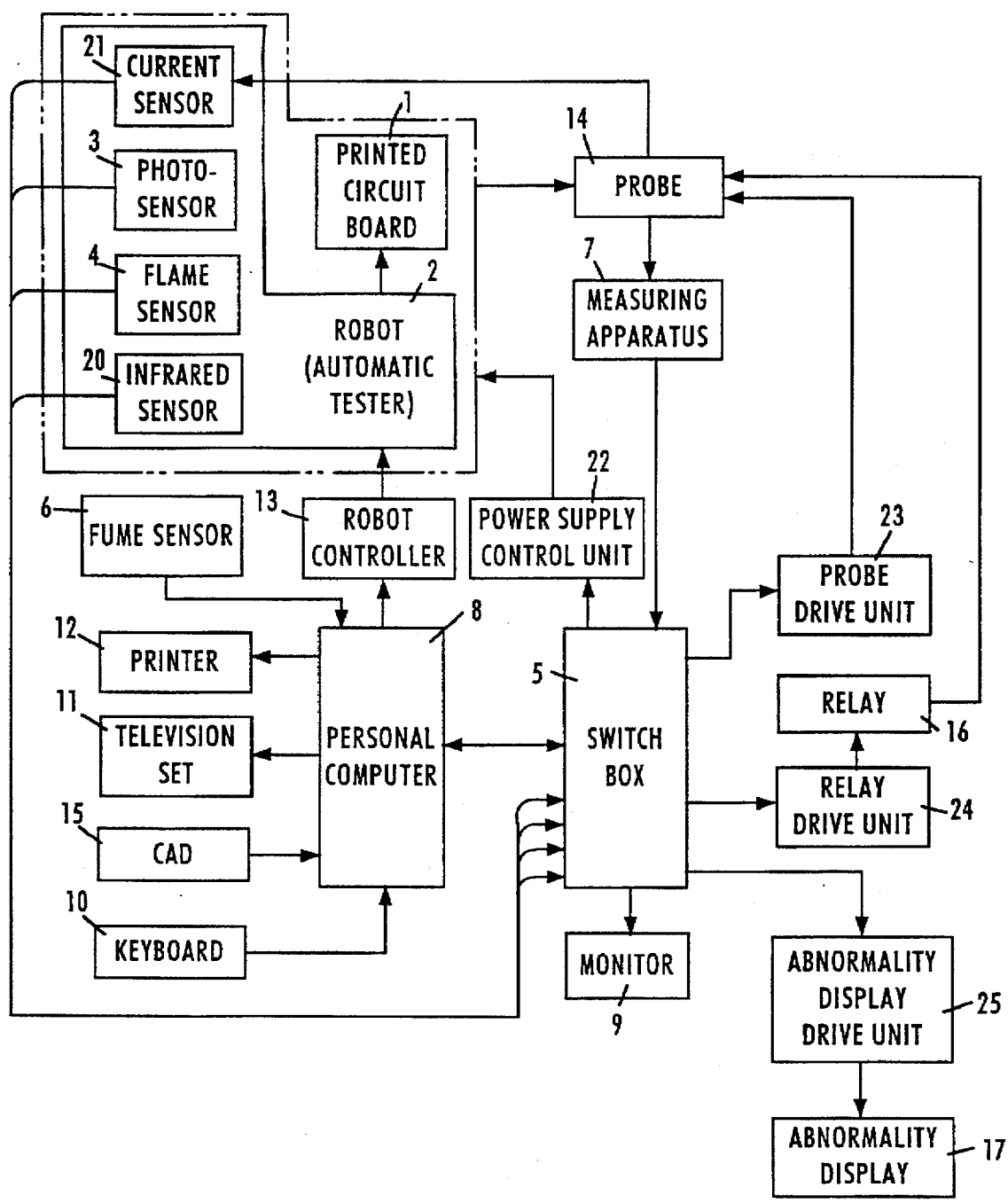
FIG. 1 is a block diagram that shows an example of the safety test equipment for printed circuit boards according to this invention.

Referring now to the drawings, the following example serves to depict in detail the safety test equipment of printed circuit boards according to this invention.

The safety test equipment for printed circuit board by this invention is shown in FIG. 1. The equipment is provided with a robot 2 functioning as an automatic tester that receives a printed circuit board 1 to be tested. The robot 2 has a photosensor 3, a flame sensor 4, an infrared sensor 20, and a current sensor 21, all intended to monitor the test results of said printed circuit board 1 by several differing means.

The photosensor 3 for distinguishing any abnormality of display unit that monitors the operation of the printed circuit board 1 and other subjects to be tested, including CRT, consists of a CdS, a phototransistor, a photodiode, and so forth. The flame sensor 4 is to detect possible ignition, while the infrared sensor 20 is used to detect possible red heat. The current sensor 21 is intended to detect the electric current that flows through the parts and the patterns at short-circuit. The fuming sensor 6 is intended to detect any fuming.

Out of these components, the photosensor 3, the flame sensor 4, the infrared sensor 20, and the current sensor 21 are connected to a personal computer 8 via a switch box 5. The fuming sensor 6, on the other hand, is linked directly with the personal computer 8.

The electrical characteristics manifested by the printed circuit board 1, for instance the voltage information and any other information causing the variations of voltage value, is detected at the level of a measuring apparatus 7 through a probe 14, and then transferred to the switch box 5 and to the personal computer 8 to be displayed on the monitor 9 for data display.

Connected to the personal computer 8 are a keyboard 10, a CAD terminal 15, a television set 11 for displaying pictures, a printer 12, and finally a robot controller 13, which is connected with the robot 2.

Connected to the switch box 5 are a power supply control unit 22 that controls the power supply of the printed circuit board 1 in order for testing, a probe drive unit 23 that drives the probe 14, a relay drive unit 24 that drives a relay 16 for opening/closing the probe, and an abnormality display drive unit 25 that drives the abnormality display 17 by means of light, sound and the like to alarm the abnormality.

Now we attempt to explain the operation of the safety test equipment of such a construction as above for printed circuit boards according to this invention.

(1) Interpart Short-Circuit Test

Based upon the information about the printed circuit boards stored in the personal computer 8 via the communication with the CAD terminal 15, the printed circuit board 1 is fixed on the rectangular coordinate type robot 2 as an automatic tester for testing such particular parts in the board 1 that will be made to act at the prescribed voltage or higher. Together with the robot 2, the printed circuit board 1 is removed up to a fixed position on a plane. Projected just under the printed circuit 1 thus displaced to the fixed position are two probes 14 to short-circuit between the two terminals of the part within the printed circuit board 1. Then the existence of the fume and/or fire is examined as well as possible red heating of two or more pieces of parts.

The existence of the fume, if any, is detected by the fuming sensor 6, while that of fire, by the flame sensor 4 with the data of respective results transferred to the personal computer 8 via the switch box 5 to be stored into the incorporated memory and displayed on the monitor 9.

Figure 2:
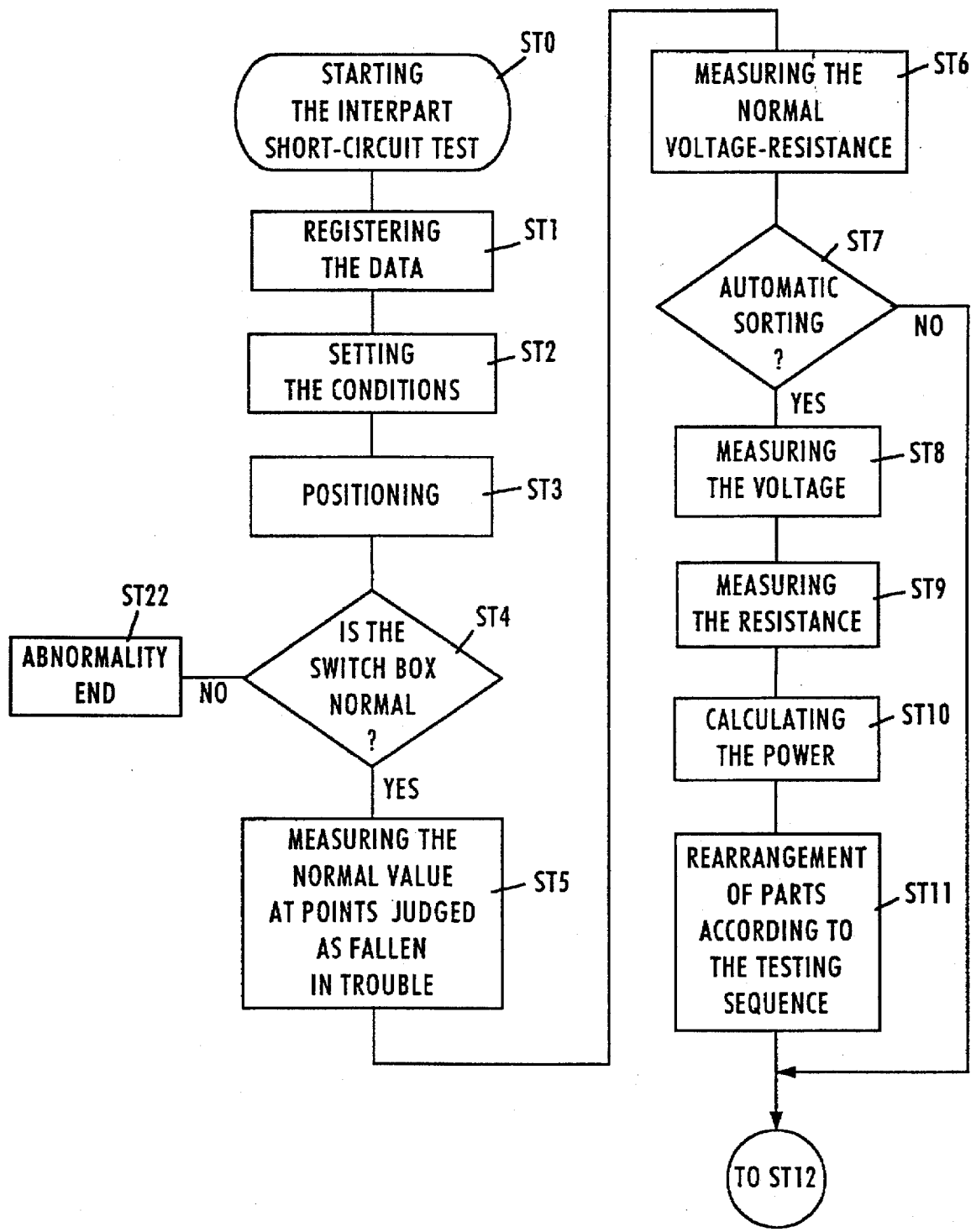
FIG. 2 is a flow chart of an interpart short-circuit test by the tester according to this invention.
Figure 3:
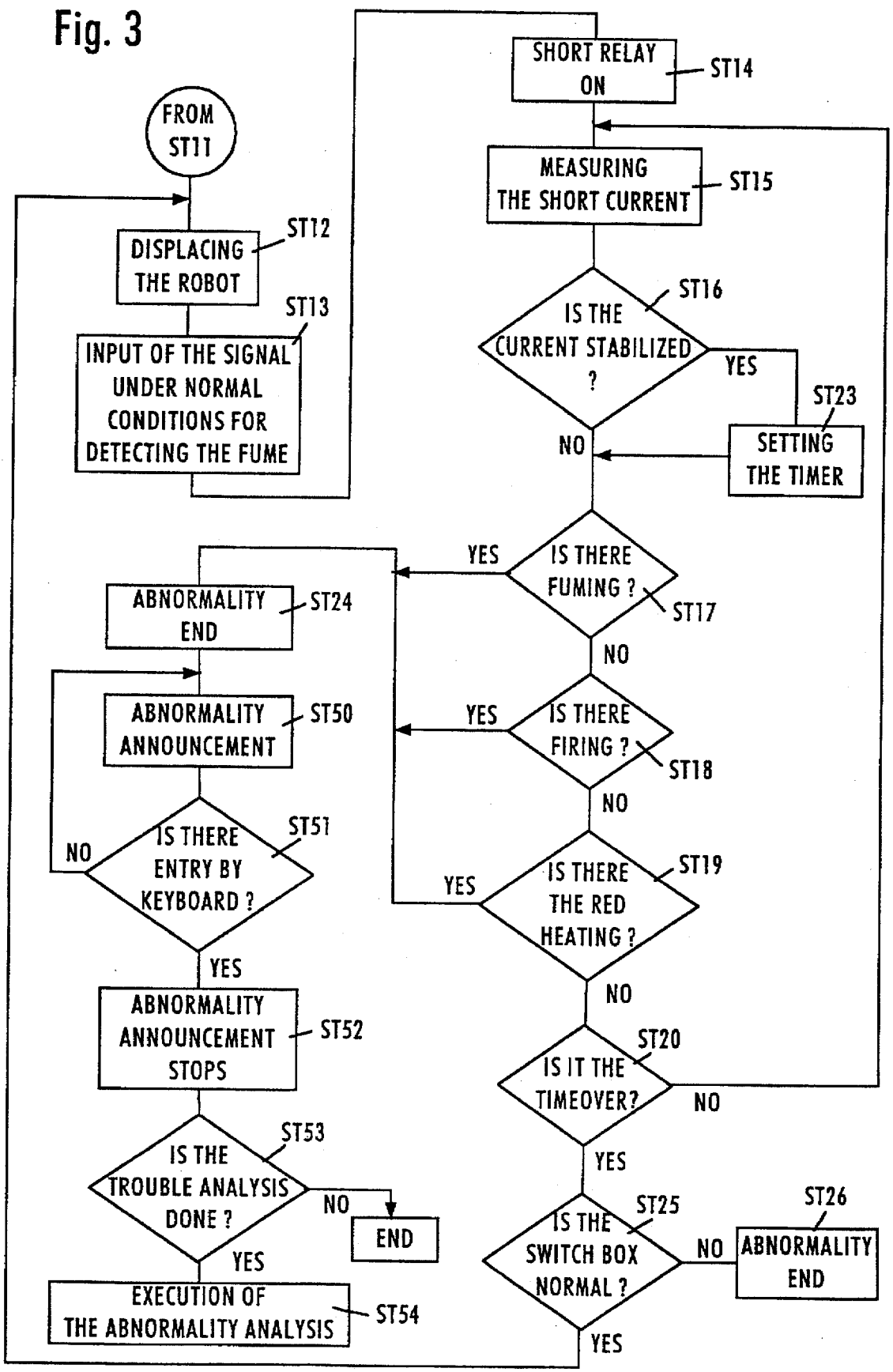
FIG. 3 is another flow chart that shows the automatic short-circuit test between the parts and patterns by the tester of this invention.

FIGS. 2 and 3 are the flow charts of the interpart short-circuit tests by the above procedures.

Started at the stage ST0 is the interpart short-circuit test.

The stage ST1 registers the data that includes the part symbols, pin numbers, pin position coordinates (X, Y), outside dimensions of the printed circuit boards, and pattern data (starting points, end points, line thickness, line types (circles, straight lines, circular arcs, etc.)).

At ST2, the short-circuit combinations are automatically made in terms of the part symbols and pin numbers, setting, for example, such conditions as resistance (1–2 pins), capacitor (1–2 pins), transistor (1–2 pins, 2–3 pins, and 1–3 pins), and IC (power supply, ground, etc.).

At the stage ST3 positioning is made of the printed circuit board 1 and the robot 2.

ST4 stage will check the operation of the switch box 5, and if any abnormality is detected at the level of this box, the test will stop at ST22.

If there be no abnormality at the switch box 5, ST5 stage will measure the normal value before the short-circuit at the position is considered to be faulty.

One measures the normal voltage and resistance values of the table for trouble analysis at the stage ST6.

One evaluates, at the stage ST7, if it matters or not the automatic sorting (automatic sequencing of the parts to be tested), and if there is no automatic sorting, the parts will undergo the short-circuit testing at ST12 as will be described later in this text.

If it matters the automatic sorting, the voltage will be measured at ST8, and the resistance value, at ST9.

ST10 will calculate the power consumption based on these measurements.

At ST11 the parts will be rearranged depending upon their power consumption, in the priority order of their testing, for instance, in the increasing or decreasing order of the power intensity.

At ST 12 the robot 2 will be displaced to make the probe enter into contact with the fixed position of the part.

The signal under normal conditions for detection of fuming will be input at the stage ST13.

The relay 16 for short-circuit will be put on at the stage ST14.

ST15 is the stage where the short-circuit current will be measured.

One judges, at the stage ST16, if the electric current has reached its stationary state. If the current has not yet attained its steady state, the interpart short-circuit test will be commenced at ST17 as will be described later.

When the current has become stable, the timer will start, at ST23, with 10 minutes if the current is 1 A or higher, and with 5 minutes if it is less than 1 A for example, in order to judge the possible existence of fume at ST17.

If there is no fuming detected, then an attempt will be made to detect possible flame at ST18.

If no flame is found out there, then one will try to detect the red heating, if any.

If there is no red heating, then one will check timeover at ST20.

If it is not timeover, ST15 is returned to, and the short-circuit current will be measured again.

In the event that any one of the flaming at AT17, the flaming at ST18 and the red heating at ST19 is detected, then the abnormality end is recognized at ST24, and the abnormality display unit 17 will announce the abnormality by way of alert sound and light of the lamp, for instance, using at ST50 a speech synthesis device.

Checked at the stage ST51 will be the key-in entry by operator, and if there is no entry by keyboard, the abnormality as under the preceding stage ST50 will be announced.

If there is any key-in input by the operator, the announcement of abnormality will end there.

One will decide whether or not any trouble analysis should be made by the robot 2 to find out the failed point.

If the analysis is to be worked out, it will be done at the stage ST54.

If this analysis is not to be performed, the test will terminate there.

If the timeover is found out at the foregoing stage ST20, the operation of the switch box 5 will be checked at ST25; if there is no abnormality found, the stage ST12 will be returned to and the robot 2 will be removed to proceed to the checking of the following part and make the probe come in contact with the position of the next part.

(2) Spacing Test

The spacing test is intended to measure and confirm if the distance between the patterns of the printed circuit board satisfies the prescribed insulating clearance. In this testing, first retrieved are any adjoining patterns out of the printed circuit board information given beforehand in the personal computer by way of the communication with the CAD terminal 15. Based upon the results of this retrieval, the printed circuit board1 is displaced on a plane together with the robot 2. The two probes 14 are projected just under the adjoining patterns in the printed circuit board 1 to measure the potential difference between said adjoining patterns by means of such measuring apparatus 7 as an oscilloscope connected to said two probes 14. The potential difference thus measured will be transferred to the personal computer 8, which will convert the difference into as much distance to be stored in the memory and displayed on the monitor 9.

Figure 4:
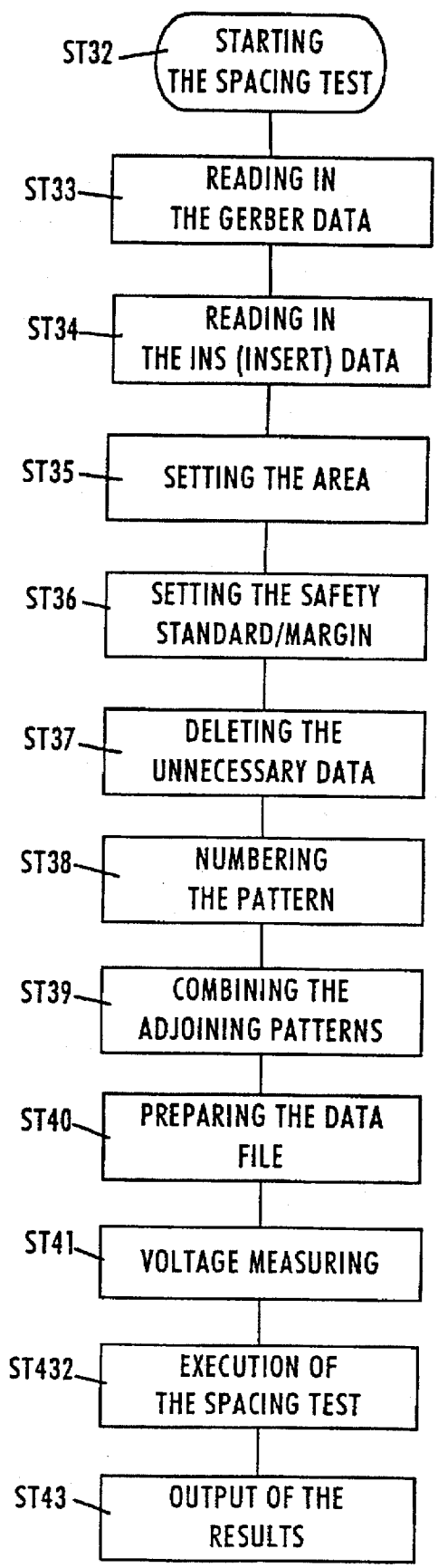
FIG. 4 is yet another flow chart that shows the spacing test using the tester according to this invention.

FIG. 4 represents the flow diagram of the spacing test following the procedures as above.

Read out from the CAD terminal 14 at the stage ST33 will be the Gerber data concerning the patterns of the printed circuit board 1.

Read in at ST34 will be the INS (insert) data concerning the insertion of parts to register such respective data as part numbers, pin numbers, pin position coordinates (X, Y), outside dimensions of the board, and the data relative to the patterns (supporting point, end point, line thickness, line type (circle, straight line, circular arc, etc.)).

The region to be tested is set at ST35, while at ST36 margins for production dispersions will be set in terms of such safety standards as UL, CSA and TUV.

At ST37, any unnecessary data will be deleted.

At ST38, pattern numbering is conducted, and continuous patterns are calculated out based on the pattern data to automatically assign the pattern numbers.

At ST 39 combination of adjoining patterns is calculated out from said pattern data to detect such largest land out of one pattern that will be taken as the point of voltage measurement.

Data file is made at ST40.

At ST41 automatic voltage is prepared.

The spacing test is then conducted at ST 42 to ensure, by calculation, that the distance between patterns corresponding to the voltage is secure, and any location is detected that cannot secure the distance.

The results of these operations will be output at the stage ST43.

(3) Interpattern Short-circuit Test

Figure 5:
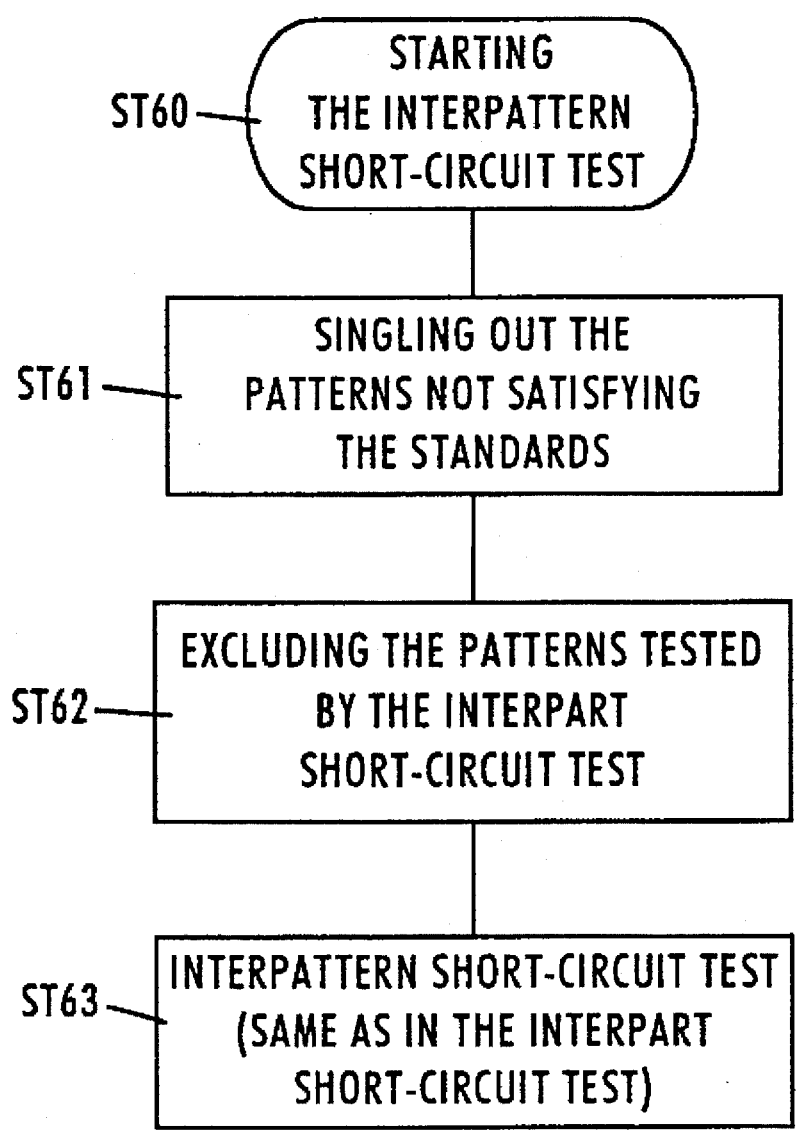
FIG. 5 represents another flow chart that illustrates the interpattern short-circuit test using the tester by this invention.

After the completion of the spacing test at ST42, the interpattern short testing will be performed. In this test, short-circuit is made for prescribed time between the patterns that do not meet the fixed insulating clearance by means of the relay for short-circuit 16 connected to said probes 14 to see the existence of fuming and firing. Now referring to FIG. 5 we attempt to explain the procedures of this interpattern short-circuit testing.

The interpattern short-circuit test will start at the stage ST60.

At ST61 such patterns that the foregoing spacing test revealed to have not met the standards will be discriminated and extracted.

At ST62 the patterns that underwent the interpattern short-circuit testing as shown in FIGS. 2 and 3 will be withdrawn.

AT ST63 the interpattern short-circuit testing will be conducted for the remaining patterns, the procedures of which are the same as in the interpart short-circuit test as shown in FIGS. 2 and 3.

In this interpattern short-circuit testing made at ST63, the following special measures are taken so that fuming detection should be able to find out even the weakest fume.

The background for photographing shall be uniform, blackout curtain, black in level. Any fuming shall be identified by light to detect the reflecting light. The data detected by the fuming sensor 6 is stored in the work area of the buffer memory of the personal computer 8, and compared with the data of the black-leveled blackout curtain as background to discriminate the differential results. For instance, the detective level will be divided into plural steps. If the detected data is higher than the step prescribed as threshold, the detected signal will be output. If any level exceeding the threshold comes out from the printed circuit board, the subject of the evaluation, the detected data will be input once again for comparison purpose. When said level exceeding the threshold is detected with prescribed frequency, it will be judged as fuming.

The screen of the monitor 9 will display a wide variety of defects. For instance, such a dynamic information as "The resistance R10 in the circuit is 1.06 k$\Omega$, which is relatively high when compared with the normal value," will be displayed as "R10, 1.06 k$\Omega$, H," while the information that "There exists a short-circuit at the positions identified as position referential numbers 100 and 102" will be displayed as "Short, 100, 102."

What is claimed is:

1. In a comprehensive safety test for the parts made to act at a prescribed voltage or higher in a printed circuit board, including an interpart short-circuit test that tries to find out the existence of fuming and firing of the parts and red heating of two or more pieces of parts by short-circuiting between these parts, a spacing test that sees if the distance between patterns of said printed circuit board meets the prescribed insulating clearance, and an interpattern short-circuit test that sees the existence of fuming and firing of the patterns that do not satisfy said prescribed insulating distance by short-circuiting between said patterns, a safety test equipment used for the printed circuit board characterized in that the equipment comprises:

an automatic tester that includes a detecting means that detects the test results of the existence of said firing as well as the red heat of at least said two parts, and performs said safety test receiving said printed circuit board, a control unit that emits a signal to control said automatic tester and inputs the data obtained from the results of said test, a memory provided at the control unit that stores the data, a displaying means that displays the test results, and a recording means that records the same test results.

2. The safety test equipment for printed circuit board as claimed in claim 1 with a means, facing to the automatic tester, to detect possible interruption of display function of the displaying means that illustrates the printed circuit board, characterized in that a photoelectric conversion device is used as said detecting means.

3. The safety test equipment for printed circuit board as claimed in claim 1 characterized in that it has a displaying means that selects prescribed portion of the printed circuit board 1 to make said displaying means display visually the image corresponding to the actual parts and patterns, subjects of the tests, in a distinct and clear fashion.

4. The safety test equipment for printed circuit board as claimed in claim 1 characterized in that said displaying means that displays visually in a clear and distinct fashion can display enlargedly the actual devices and patterns, subjects of the tests.

5. The safety test equipment for printed circuit board as claimed in claim 1 characterized in that the control at the level of the control unit allows the parts and patterns, subjects of the tests for the printed circuit board 1, to be displayed on the displaying means one after another.

6. The safety test equipment for printed circuit board as claimed in claim 1 characterized in that the outer diameter of the image corresponding to that of the printed circuit board 1 can be displayed so that not merely the parts of the printed circuit board 1 should be able to be displayed but the portions of the parts and patterns thus displayed can be readily found out.

7. The safety test equipment for printed circuit board as claimed in claim 1 characterized in that an infrared sensor is used as a firing detection means.

8. The safety test equipment for printed circuit board as claimed in claim 1 characterized in that the interpart short-circuit test can be performed in conformity with the sequential arrangement of the patterns that are arranged according to the order of largeness of their power consumption as calculated.

9. The safety test equipment for printed circuit board as claimed in claim 1 characterized in that the interpart short-circuit test can be performed in such a fashion that the combination of the parts to be shorted may be automatically made based on the registered input of the CAD data.

10. The safety test equipment for printed circuit board as claimed in claim 1 characterized in that the combination of the parts to be shorted utilzies the power consumption of the parts as registered in the CAD data.

11. The safety test equipment for a printed circuit board as claimed in claim 1, further comprising:

means for detecting the existence of said fuming of the parts.

12. The safety test equipment for printed circuit board as claimed in claim 11 characterized in that said means for detecting the existence of fuming is provided with a threshold setting portion in such a way that the results of the comparison by said comparing unit can be compared with the thresholds of said threshold setting portion.

13. The safety test equipment for printed circuit board as claimed in claim 12 characterized in that the comparison with the minimum threshold is repeated at least twice.

* * * * *